(12) United States Patent
Wong et al.

(10) Patent No.: US 7,701,238 B2
(45) Date of Patent: Apr. 20, 2010

(54) ACTIVE THERMAL CONTROL USING A BURN-IN SOCKET HEATING ELEMENT

(75) Inventors: Anthony Yeh Chiing Wong, Pulau Pinang (MY); Victor Henckel, Seattle, WA (US); Boon Liang Heng, Kuala Lumpur (MY); Christopher Wade Ackerman, Phoenix, AZ (US); James C. Shipley, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 11/821,864

(22) Filed: Jun. 26, 2007

(65) Prior Publication Data
US 2009/0002010 A1 Jan. 1, 2009

(51) Int. Cl.
*G01R 31/02* (2006.01)
(52) U.S. Cl. ...................................................... 324/763
(58) Field of Classification Search ................ 324/760, 324/765, 158.1, 763, 755, 758; 257/48; 438/14–18
See application file for complete search history.

(56) References Cited

U.S. PATENT DOCUMENTS

| 6,437,588 | B2 * | 8/2002 | Akram ........................ 324/760 |
| 6,900,650 | B1 * | 5/2005 | Sheng et al. ................. 324/760 |
| 7,042,240 | B2 * | 5/2006 | Lopez et al. ................. 324/760 |
| 2005/0104611 | A1 * | 5/2005 | Hong et al. .................. 324/760 |
| 2006/0290366 | A1 | 12/2006 | Kon et al. .................... 324/760 |

OTHER PUBLICATIONS

Harold Hamilton, et al., "Burn-In for High-Power Devices," Mar. 2006, pp. 1-6.
Advanced Test Technologies, "Single Site iSocket™ (SSiS)," Sep. 25, 2006, 1 page.

* cited by examiner

*Primary Examiner*—Ha Tran T Nguyen
*Assistant Examiner*—Tung X. Nguyen
(74) *Attorney, Agent, or Firm*—Trop, Pruner & Hu, P.C.

(57) ABSTRACT

In one embodiment, the present invention includes a burn-socket for insertion into a test board, where the burn-in socket is coupled to receive a semiconductor device under test (DUT). The burn-in socket includes a substrate to support the semiconductor DUT, which includes a heating element embedded in a layer of the substrate. Other embodiments are described and claimed.

8 Claims, 4 Drawing Sheets

ACTIVE THERMAL CONTROL USING A BURN-IN SOCKET HEATING ELEMENT

BACKGROUND

Many semiconductor devices such as processors, chipsets, and so forth often go through extensive testing after manufacture to verify performance levels and prevent devices likely to fail from being shipped. To perform high volume manufacturing (HVM) testing, so-called burn-in boards are used which include a number of burn-in sockets in which completed semiconductor devices can be inserted to perform the burn-in testing. During burn-in testing, oftentimes an external thermal control unit is coupled to the burn-in board to heat the burn-in board and thus the associated semiconductor devices to a high temperature for the burn-in testing process. However, such external thermal control units require complex mechanical engagement systems and critical alignment. Furthermore, the heaters of such a unit have a fixed matrix that causes the burn-in socket density on the burn-in board to be non-configurable.

Furthermore, while such burn-in boards have been developed for testing high power devices, current semiconductor trends are to provide semiconductor devices that operate at lower power levels such as low power microprocessors, ultra mobile personal computer (UMPC) devices, network communication devices and so forth. Burn-in systems developed for high power systems are costly and are used to support burn-in of power devices greater than approximately 200 Watts. In contrast, lower power products typically have power requirements less than 100 Watts and often less than 30 Watts. It is difficult to perform burn-in of low power products on high power systems. For example, to test low power devices on a high power system, a longer burn-in time is needed, as typically a thermal control system may not be available for testing such low power devices.

DETAILED DESCRIPTION

In various embodiments, a burn-in socket may be provided with a heating element to enable heating of a semiconductor device coupled to the burn-in socket during burn-in testing. For example, in various implementations a burn-in socket floating carrier may have a heating element formed, e.g., of a metal trace formed within a layer of the carrier. In this way, power may be provided to the heating element during burn-in testing to enable associated heating of the semiconductor device, e.g., a low power device to enable faster burn-in testing.

Figure 1:
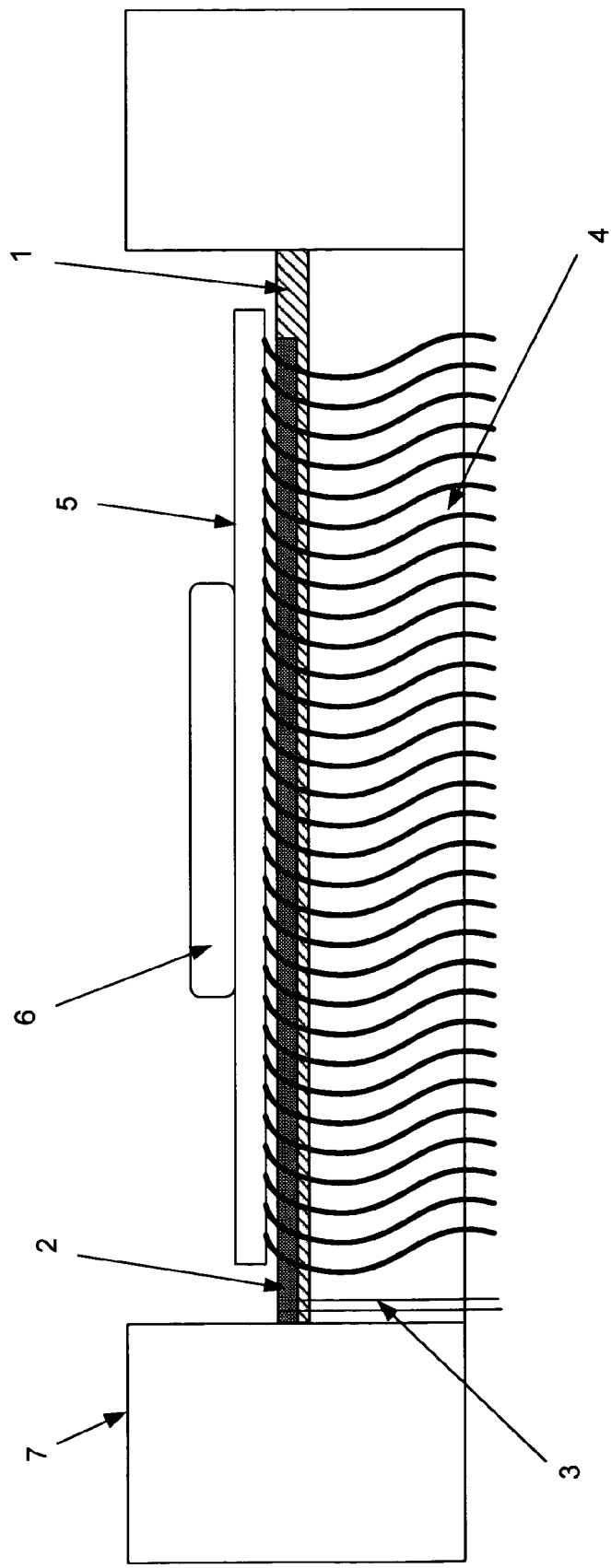
FIG. 1 is a cross-sectional view of a burn-in socket in accordance with one embodiment of the present invention.

Referring now to FIG. 1, shown is a cross-sectional view of a burn-in socket in accordance with one embodiment of the present invention. As shown in FIG. 1, burn-in socket (BIS) 7 may include a burn-in socket floating carrier 1. As shown in this cross-sectional view a heating element 2, which may be a metal heating trace provided, e.g., in a serpentine fashion, may be formed in the substrate of floating carrier 1, which in some embodiments may be a printed circuit board (PCB). As further shown in FIG. 1, a package or DUT 5 may be affixed to BIS 7 by coupling to a plurality of BIS pins 4 extending from BIS 7 to mate with a test board such as a burn-in board (not shown in FIG. 1). In turn a die/heat sink 6 may be adapted on DUT 5. Power for heating element 2 may be provided by a floating carrier heater power supply connection 3. Note that connection 3 may couple BIS 7 to a corresponding power supply of a control unit associated with the burn-in board, or the burn-in socket may include its own independent power supply. While shown with this particular implementation in the embodiment of FIG. 1, the scope of the present invention is not limited in this regard and a burn-in socket having a built-in heater element may take many different forms.

Figure 2:
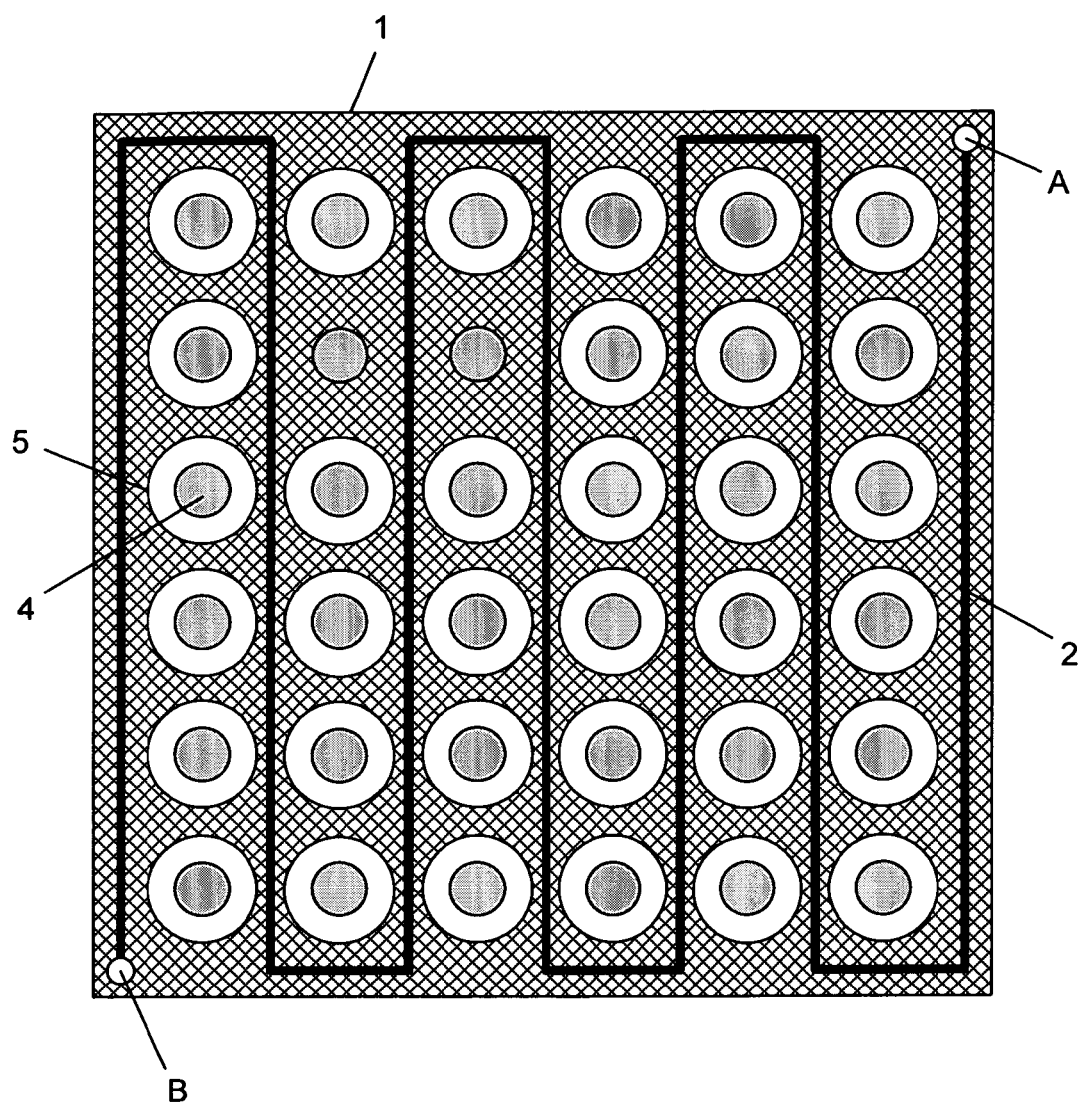
FIG. 2 is a top view of a floating carrier in accordance with an embodiment of the present invention.

Referring now to FIG. 2, shown is a top view of a floating carrier in accordance with an embodiment of the present invention. As shown in FIG. 2, carrier 1 includes a plurality of pin holes 5 for receiving BIS pins 4 (as shown in FIG. 1 above), which may form a BIS pin array. As shown in FIG. 2, heating element 2 may be of a generally serpentine shape to be routed through the pin array to ensure even distribution of heat across a DUT coupled to burn-in socket 7. Note that heating element 2 includes a first port A and a second port B, e.g., positive and negative terminals to receive a voltage from an associated power supply.

Thus each burn-in socket to be adapted to a burn-in board may include a heating element in accordance with an embodiment of the present invention. Because DUTs having different performance characteristics may be adapted to the burn-in sockets during burn-in testing, individual control of the heating elements may be realized, in some embodiments.

Figure 3:
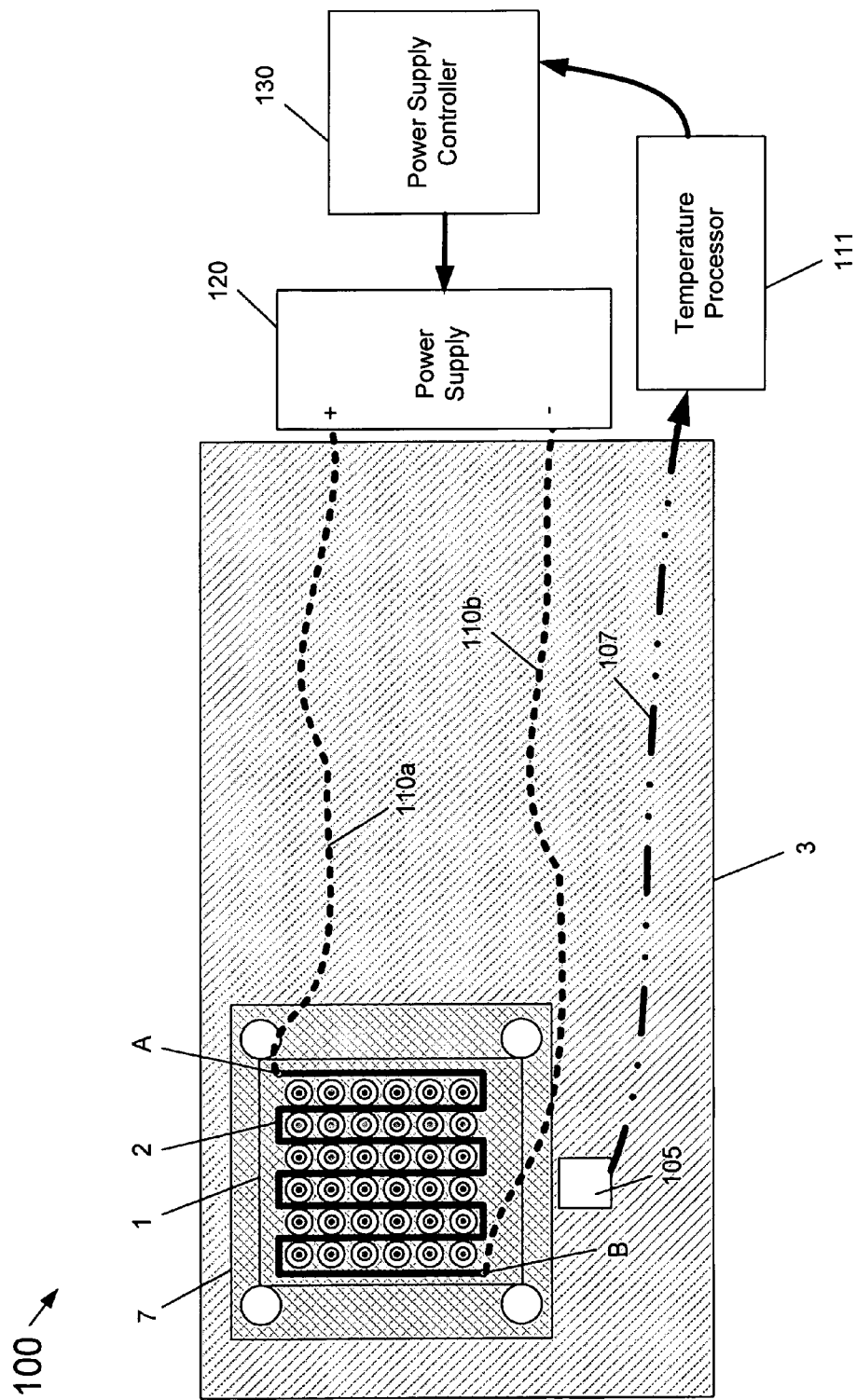
FIG. 3 is a block diagram of a thermal control system in accordance with an embodiment of the present invention.

Referring now to FIG. 3, shown is a block diagram of a thermal control system in accordance with an embodiment of the present invention. As shown in FIG. 3, thermal control system 100 may be used to individually monitor and control the thermal profile of each of multiple burn-in sockets adapted to a burn-in board. While shown in the embodiment of FIG. 3 with only a single such heating element and burn-in socket for ease of illustration, understand the scope of the present invention is not limited in this regard and in various embodiments many such heating elements and burn-in sockets may be present. Note that the same reference numerals used in FIGS. 1 and 2 are used in FIG. 3 to refer to the same components. As shown in FIG. 3, BIB 3 includes a BIS 7 including a heating element 2 of floating carrier 1 having ports A and B that are coupled to, respectively, positive and negative voltage supply lines $110_a$ and $110_b$. Accordingly, heating element 2 receives power from a power supply 120 that in turn is controlled by a power supply controller 130. Understand that while only this single heating element 2 is shown coupled to supply lines $100_a$ and $110_b$, multiple such heating elements of different BISs may be adapted to these voltage supply lines.

Power to heating element 2 may be controlled by applying a selective voltage level to power supply 120. To determine a desired level, feedback information obtained from a temperature sensor 105 may be provided via a feedback line 107 to a temperature processor 111. Note that temperature sensor 105 may be placed in close proximity to the heater trace (and the burn-in socket (and thus a DUT thereon) to measure temperature emanating from the DUT. Furthermore, thermal sensor 105 may provide information regarding its own temperature, which may also closely correspond to that of the associated heating element 2. Based on this information, temperature processor 111 may process the data and send commands to power supply controller 130, which in turn may control the voltage provided by power supply 120 accordingly. Thus power supply controller 130 may provide information to adjust the power supply voltage level to match a desired temperature or may turn off power supply 120 completely if the detected temperature exceeds a threshold value.

Note that while shown with these limited components in the embodiment of FIG. 3, additional components may be present in a given burn-in system. For example, multiple power supplies may be present, with power supply 120 shown in FIG. 3 being a secondary power supply. That is, during testing of high power devices, both a primary power supply (not shown in FIG. 3) and power supply 120 may be used to provide power to the semiconductor DUTs in each of burn-in sockets 7 on burn-in board 3, under control of power supply controller 130. However, during testing of lower power devices, power requirements are lower and thus both power supplies are not needed to power the devices. Instead, one of the power supplies, e.g., power supply 120 may be controlled to instead provide power via voltage supply lines 110a and 110b to the various heater elements 2 of each burn-in socket 7. Accordingly, a switch or other selection means may be present to enable providing the power to either semiconductor DUTs or corresponding heater elements based on a type of test to be run on the devices, as well as based on a type of DUT. Accordingly, heater elements 2 embedded within floating carrier 1 of individual BISs 7 may be enabled for certain test operations, such as testing of low power devices while such heater elements may be disabled for other testing, such as testing of high powered devices.

While shown with this particular implementation in the embodiments of FIGS. 1-3, understand the scope of the present invention is not limited in this regard and in various embodiments, different configurations for heater elements as well as sensing and control circuitry may be realized. Furthermore, understand that different types of thermal sensors as well as temperature processors, power supplies and controllers may be implemented, both on a given burn-in socket, burn-in board or associated therewith such as a separate control circuit for the burn-in board.

Figure 4:
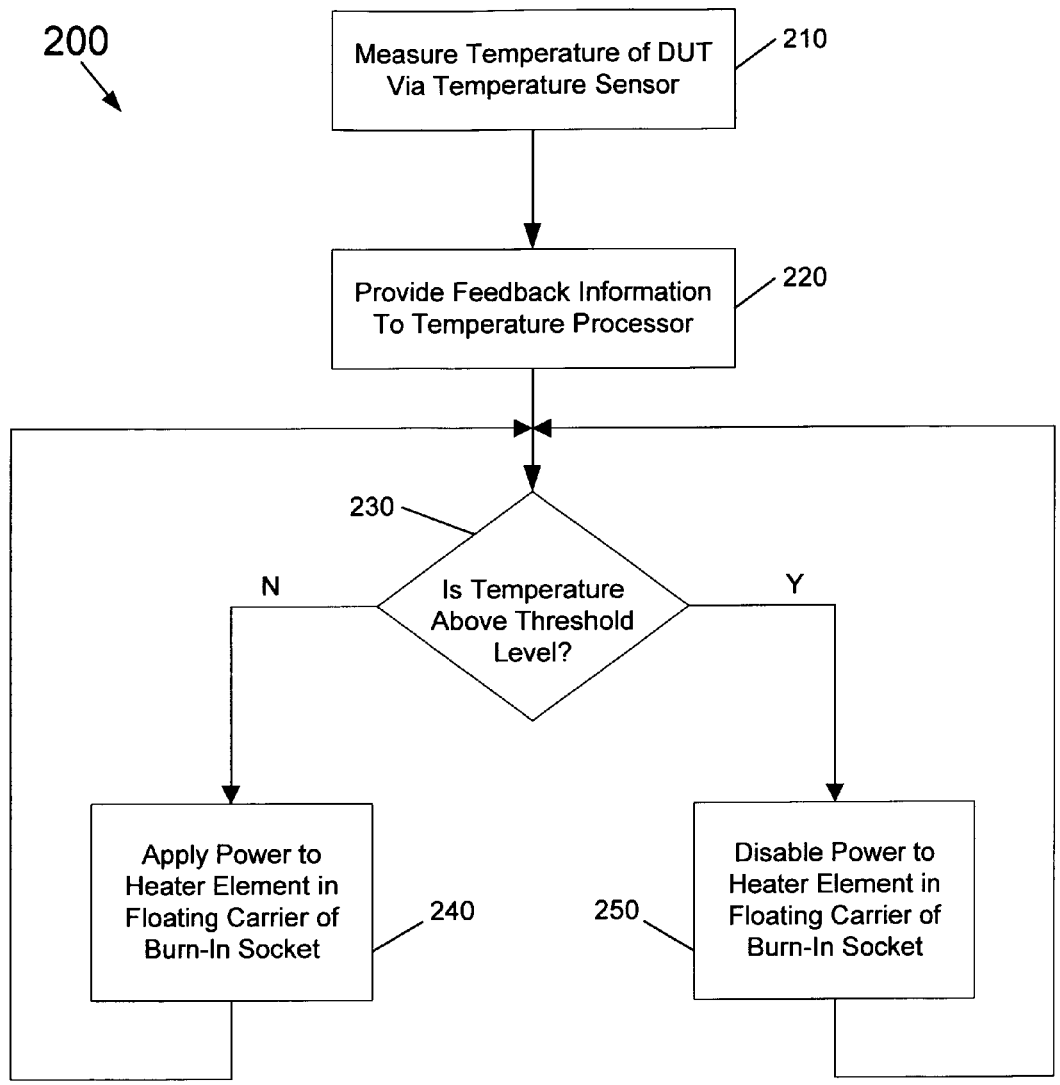
FIG. 4 is a flow diagram of a method in accordance with one embodiment of the present invention.

Referring now to FIG. 4, shown is a flow diagram of a method in accordance with one embodiment of the present invention. As shown in FIG. 4, method 200 may be performed to control the temperature of each individual DUT located in a burn-in socket coupled to a burn-in board individually. As shown in FIG. 4, method 200 may begin by measuring a temperature of the DUT via a temperature sensor (block 210). Feedback information regarding the temperature may be provided to a temperature processor (block 220). For example, signal traces within the burn-in board may be provided from the temperature sensor to a temperature processor, which may be located in an external control unit coupled to the burn-in board. Next, it may be determined whether the temperature is above a threshold level (diamond 230). Such a threshold level may vary depending on a type of semiconductor device (e.g., low power/high power device), burn-in testing process and so forth. Based on the temperature, power may be applied to a heater element in a floating carrier of the burn-in socket (block 240), if the temperature is not above the threshold level, otherwise such power may be disabled (block 250). As shown in FIG. 4, from both the blocks 240 and 250, control may pass back to diamond 230. While shown with this particular implementation in the embodiment of FIG. 4, the scope of the present invention is not limited in this regard.

By providing thermal heat through conduction to DUTs, such as low power devices, the time required during a burn-in test for the device to achieve its burn-in junction temperature may be shorter, thus reducing overall burn-in time. Furthermore, the need for an expensive external thermal control array may be avoided. In addition to the costs for such a thermal control array, space may be minimized and furthermore, flexibility of burn-in board device density may also be achieved.

For example, in some implementations between four and seven times burn-in time reduction may be realized depending on DUT power, leading to an equivalent amount of tooling utilization improvements. In various embodiments, a burn-in time calculation may be in accordance with Equation 1:

$$BIT_B = \frac{BIT_A}{e^{\left(\frac{E_a}{k}\left(\frac{1}{T_A}-\frac{1}{T_B}\right)\right)}} \quad [EQ. 1]$$

where $BIT_A$ and $BIT_B$ correspond to burn-in times for a burn-in test without heaters and with heaters in accordance with one embodiment of the present invention, respectively, Ea (Thermal activation energy) which is typically 0.6 electron volts (eV), k (Boltzmann's constant) is 8.6×10-5 eV/Kelvin (K), and $T_A$ and $T_B$ are Burn In Temperatures in absolute temperature (K), achieved during such testing.

Using embodiments of the present invention, it is modeled that a 10 Watt device may achieve a $T_A$ of 51 degrees Celsius (C.) without an embodiment of the present and a $T_B$ of 79 C. with an embodiment of the present invention. In this way, an improvement of approximately 5.5 times may be realized.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations there from. It is intended that the appended claims cover all such modifications and variations as fall within the true spirit and scope of this present invention.

What is claimed is:

1. An apparatus comprising:
    a burn-in socket for insertion into a test board including a plurality of socket locations, the burn-in socket to receive a semiconductor device under test (DUT), the burn-in socket comprising a floating carrier including a plurality of pins extending from the floating carrier to the test board to couple the semiconductor DUT to the test board, the floating carrier to support the semiconductor DUT and having a plurality of contacts to mate with corresponding contacts of the semiconductor DUT, wherein the floating carrier includes a heating element to enable even distribution of heat across the semiconductor DUT, the heating element comprising a heater trace formed within a layer of the floating carrier and having a substantially serpentine shape routed through the plurality of pins.

2. The apparatus of claim 1, further comprising:
the test board including a plurality of burn-in sockets coupled thereto, each burn-in socket including a heating element embedded in a substrate thereof;
a power supply;
a supply line coupled to the power supply and to each of the burn-in sockets to provide power to the heating elements; and
a power supply controller coupled to the power supply to control the power supply.

3. The apparatus of claim 2, further comprising a temperature sensor associated with each burn-in socket to provide temperature information regarding the heating element and the semiconductor DUT.

4. The apparatus of claim 3, further comprising a temperature processor coupled to the temperature sensors to individually control a temperature of each of the heating elements based on the temperature information from the corresponding temperature sensor, via control signals provided to the power supply controller.

5. The apparatus of claim 2, wherein the power supply comprises a secondary power supply, wherein the secondary power supply is to provide power to the semiconductor DUTs if the semiconductor DUTs are high power devices, and to provide power to the heating elements if the semiconductor DUTs are low power devices.

6. The apparatus of claim 3, wherein the heating element is to be enabled if the corresponding semiconductor DUT has a power level less than a predetermined threshold, otherwise the heating element is to be disabled.

7. A system comprising:
a test board including a plurality of burn-in sockets coupled thereto, each burn-in socket comprising a floating carrier including a plurality of pins extending from the floating carrier to the test board to couple a semiconductor device under test (DUT) to the test board, the floating carrier to support the semiconductor DUT and having a plurality of contacts to mate with corresponding contacts of the semiconductor DUT, wherein the floating carrier includes a heating element to enable even distribution of heat across the semiconductor DUT, and formed from a heater trace configured within a layer of the floating carrier and having a substantially serpentine shape routed through the plurality of pins;
a first power supply to provide power to the semiconductor DUTs;
a second power supply to provide power to the semiconductor DUTs if the semiconductor DUTs are high power devices, and to provide power to the heating elements if the semiconductor DUTs are low power devices;
a supply line coupled to the second power supply and to each of the burn-in sockets to provide power to the heating element of each of the burn-in sockets; and
a power supply controller coupled to the first and second power supplies to control the first and second power supplies.

8. The system of claim 7, further comprising a temperature processor coupled to a temperature sensor associated with each of the burn-in sockets to individually control a temperature of each of the heating elements based on the temperature information from the corresponding temperature sensor, via control signals provided to the power supply controller.

* * * * *